(12) United States Patent
Aseev et al.

(10) Patent No.: US 11,404,624 B2
(45) Date of Patent: Aug. 2, 2022

(54) FABRICATION OF A QUANTUM DEVICE

(71) Applicant: Microsoft Technology Licensing, LLC, Redmond, WA (US)

(72) Inventors: Pavel Aseev, Novotroitsk (RU); Philippe Caroff-Gaonac'h, Delft (NL)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/018,972

(22) Filed: Sep. 11, 2020

(65) Prior Publication Data
US 2020/0411744 A1    Dec. 31, 2020

Related U.S. Application Data

(62) Division of application No. 16/252,230, filed on Jan. 18, 2019, now Pat. No. 10,777,728.

(51) Int. Cl.
*H01L 39/24*    (2006.01)
*G06N 10/00*    (2022.01)
(Continued)

(52) U.S. Cl.
CPC ......... *H01L 39/2493* (2013.01); *G06N 10/00* (2019.01); *H01L 39/12* (2013.01); *H01L 39/223* (2013.01)

(58) Field of Classification Search
CPC ..................................................... H01L 39/10
See application file for complete search history.

(56) References Cited

U.S. PATENT DOCUMENTS 9,653,286 B2    5/2017    Ohlsson et al.
9,934,967 B2    4/2018    Hydrick et al.
(Continued)

FOREIGN PATENT DOCUMENTS

DE    10-2017-002-616    9/2018
WO    WO 2016/000836    1/2016
(Continued)

OTHER PUBLICATIONS

Brubaker et al., "Polarity-Controlled GaN/AlN Nucleation Layers for Selective-Area Growth of GaN Nanowire Arrays on Si(111) Substrates by Molecular Beam Epitaxy," *Journal of National Institute of Standards and Technology*, 2 pages (Dec. 18, 2015).
(Continued)

*Primary Examiner* — Mounir S Amer
(74) *Attorney, Agent, or Firm* — Klarquist Sparkman, LLP

(57) ABSTRACT

In a masking phase, a first segment of an amorphous mask is formed on an underlying layer of a substrate. The first segment comprises a first set of trenches exposing the underlying layer. In the masking phase, a second segment of the amorphous mask is formed on the underlying layer. The second segment comprises a second set of trenches exposing the underlying layer. The segments are non-overlapping. An open end of one of the first set of trenches faces an open end of one of the second set of trenches, but the ends are separated by a portion of the amorphous mask. In a semiconductor growth phase, semiconductor material is grown, by selective area growth, in the first and second sets of trenches to form first and second sub-networks of nanowires on the underlying layer. The first and second sub-networks of nanowires are joined to form a single nanowire network.

19 Claims, 8 Drawing Sheets

(51) Int. Cl.
*H01L 39/12* (2006.01)
*H01L 39/22* (2006.01)

(56) References Cited

U.S. PATENT DOCUMENTS

| | | | |
|---|---|---|---|
| 10,978,632 | B2 | 4/2021 | Kallaher et al. |
| 2012/0085991 | A1 | 4/2012 | Cohen et al. |
| 2014/0335215 | A1 | 11/2014 | Hayashi et al. |
| 2015/0118777 | A1* | 4/2015 | Seo .................. H01L 33/20 438/34 |
| 2017/0141287 | A1 | 5/2017 | Barkeshli et al. |
| 2018/0204977 | A1 | 7/2018 | Dheeraj et al. |
| 2018/0233583 | A1* | 8/2018 | Schepis ............ H01L 29/42392 |
| 2021/0257537 | A1 | 8/2021 | Kallaher et al. |

FOREIGN PATENT DOCUMENTS

| | | |
|---|---|---|
| WO | WO 2019/001753 | 1/2019 |
| WO | WO 2019/099171 | 5/2019 |

OTHER PUBLICATIONS

Hiramatsu, "Epitaxial lateral overgrowth techniques used in group III nitride epitaxy," *Journal of Physics: Condensed Matter*, 13:6961-6975 (Jul. 26, 2001).

Hiruma et al., "Fabrication of Axial and Radial Heterostructures for Semiconductor Nanowires by Using Selective-Area Metal-Organic Vapor-Phase Epitaxy," *Journal of Nanotechnology*, 2012:1-29 (Jan. 2012).

International Search Report and Written Opinion dated Mar. 24, 2020, from International Patent Application No. PCT/US2020/012286, 12 pp.

International Search Report and Written Opinion dated Apr. 8, 2020, from International Patent Application No. PCT/US2020/012285, 13 pp.

Krizek, "Semiconductor Nanowire Networks Grown by Molecular Beam Epitaxy," Ph.D. Thesis, University of Copenhagen, 190 pages (Jul. 20, 2018).

Lyu et al., "Protected gap closing in Josephson junctions constructed on $Bi_2Te_3$ surface," available at: arXiv:1603.04540v2, 15 pages (Sep. 11, 2018).

Non-Final Office Action issued in U.S. Appl. No. 16/252,237, dated May 13, 2020, 5 pages.

Roddaro et al., "InAs nanowire hot-electron Josephson transistor," available at: arXiv:1003.2140v1, 6 pages (Mar. 10, 2010).

Xiang et al., "Ge/Si nanowire mesoscopic Josephson junctions," *Journal of Nature Nanotechnology*, 1, 25 pages (Dec. 6, 2006).

Zhang et al., "A review of III-V planar nano wire arrays: selective lateral VLS epitaxy and 3D transistors," *Journal of Physics D: Applied Physics*, 50:1-21 (2017).

* cited by examiner

FABRICATION OF A QUANTUM DEVICE

CROSS REFERENCE TO RELATED APPLICATIONS

This application is a divisional of U.S. patent application Ser. No. 16/252,230, filed Jan. 18, 2019, now U.S. Pat. No. 10,777,728, which are incorporated by reference herein.

TECHNICAL FIELD

This application relates to a method of fabricating a quantum device and the resulting quantum device. Such a quantum device may be used, for example, in a quantum computer.

BACKGROUND

Quantum computing is a class of computing in which inherently quantum mechanical phenomena, such as quantum state superposition and entanglement, are harnessed to perform certain computations far more quickly than any classical computer could ever be capable of. In a "topological" quantum computer, calculations are performed by manipulating quasiparticles—called "non-abelian anyons"—that occur in certain physical systems. Anyons have unique physical characteristics that distinguish them from both fermions and bosons. Non-abelian anyons also have unique properties with respect to abelian anyons. It is these unique properties that serve as a basis for topological quantum computing, in which information is encoded as a topological property of non-abelian anyons; specifically the braiding of their space-time worldlines. This has certain benefits over other models of quantum computation. One key benefit is stability, as the quantum braiding is unaffected by perturbations on a scale that could cause error-inducing quantum decoherence in other types of quantum computer.

Broadly speaking, to date, two types of physical system have been considered as potential hosts of non-abelian anyons, namely "5/2 fractional quantum Hall" systems in condensed matter physics, and (more recently) semiconductor-superconductor (SE/SU) nanowires. With regard to the latter, a key advance in the field was the realization that non-abelian anyons, in the form of "Majorana zero modes" (MZMs), can be formed in regions of semiconductor (SE) coupled to a superconductor (SU). Based on this phenomenon, a network of SE/SU nanowires can be used to create a quantum bit, wherein each SE/SU nanowire comprises a length of semiconductor coated with a superconductor.

A quantum bit, or qubit, is an element upon which a measurement with two possible outcomes can be performed, but which at any given time (when not being measured) can in fact be in a quantum superposition of the two states corresponding to the different outcomes.

A "topological" qubit is a qubit implemented based on the above-mentioned technology of non-abelian anyons in the form of MZMs. A non-abelian anyon is a type of quasiparticle, meaning not a particle per se, but an excitation in an electron liquid that behaves at least partially like a particle. Particularly an anyon is a quasiparticle occurring in a two-dimensional system (two degrees of freedom in space). A Majorana zero mode is a particular bound state of such quasiparticles. Under certain conditions, these states can be formed in close to the semiconductor/superconductor interface in an SE/SU nanowire network, in a manner that enables them to be manipulated as quantum bits for the purpose of quantum computing. Regions or "segments" of the nanowire network between the MZMs are said to be in the "topological" regime.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

Whilst recent developments in fabrication technology have led to significant improvements in the quality of nanowire networks, the approaches in question are all facing challenges with scalability and/or quality. This imposes limits on the size and complexity of the nanowire networks that can be fabricated with these approaches.

Various micro/nanofabrication methods can be used to produce high-quality semiconductor (superconductor and insulating as well) structures required for quantum devices for potential use in the field of quantum computation. There are specific challenges in the case of epitaxial structures (in-plane wire networks) where a mask is used to guide the growth process, which may be kinetically or/and thermodynamically controlled.

One challenge concerns defect engineering. Defect-free regions in nanowire networks are of limited size (typically a few microns). Structural defects randomly occur within the structure of the size beyond that critical dimension. This is detrimental to the device quality because defective regions can occur inside its active region, negatively impacting electronic transport.

Another challenge concerns scalability. In some specific cases, due to fundamental kinetic and/or thermodynamic limitations the maximum achievable size of produced structures (e.g. networks) is limited to just a few tens of microns. This renders some fabrication methods to be non-scalable despite the fact that they can yield high-quality structures on a smaller level. There is a natural need to make such methods scalable for large scale applications.

Embodiments of the present invention provide methods of fabricating nanowire structures, which can not only produce high quality structures but can also do so in a scalable manner to allow the production of large and potentially complex nanowire networks.

According to one aspect disclosed herein, there may be provided a method of fabricating a quantum device, the method comprising: in a masking phase, forming a first segment of an amorphous mask on an underlying layer of a substrate, wherein the first segment comprises a first set of trenches exposing the underlying layer; in the masking phase, forming a second segment of the amorphous mask on the underlying layer, wherein the second segment comprises a second set of trenches exposing the underlying layer, wherein the first and second segments are non-overlapping, and wherein an open end of one of the first set of trenches faces an open end of one of the second set of trenches, but the ends being separated by a portion of the amorphous mask; in a semiconductor growth phase, growing, by selective-area-growth, semiconductor material in the first and second sets of trenches to form first and second sub-networks of nanowires on the underlying layer; and joining the first and second sub-networks of nanowires to form a single nanowire network on the underlying layer.

The first and second segments may be formed at the same time. That is, the first and second sets of trenches may be formed at the same time. Alternatively, the first and second segments may be formed one after the other.

The separated trenches thus form first and second parts of an overall (i.e. wider or larger) trench (i.e. channel) defining a nanowire but with a discontinuity in the overall trench formed by said portion of the mask. In other words, said portion of the mask effectively acts as a discontinuity in a longer trench formed by the separated trenches. The portion is preferably of the order of a few nanometres in the direction of the trench. It is a feature of some selective area growth techniques that the probability a trench being filled increases with a reduction in surface area. In the cases where, due to fundamental kinetic and/or thermodynamic limitations, the maximum achievable size of produced structures (e.g. networks) is limited to just a few tens of microns, it is beneficial to segment a large mask into smaller segments, to increase the chances of a completely grown nanowire network.

Embodiments of the invention use a segmentation approach to build a single (i.e. larger) nanowire network from two or more sub-networks (i.e. smaller networks) of nanowires. This enables growth methods, which are not capable of producing large structures, to be used on a larger scale (e.g. a wafer scale). Embodiments also enable effective defect engineering within large scale nanowire networks as defects are constrained to the separations between the segments of the mask, i.e. between the open end of one of the first set of trenches and the open end of one of the second set of trenches.

In embodiments, said joining may comprise merging by lateral growth of the semiconductor material during the semiconductor growth phase.

Alternatively, said joining may comprise, in a subsequent phase to the semiconductor growth phase, connecting the open end of the one of the first set of trenches with the open end of the one of the second set of trenches via an electrical conductor.

In embodiments, the underlying layer may be a wafer of the substrate. Alternatively, one or more intermediate layers may be disposed between the mask and the wafer.

In embodiments, the open end of first trench of the first set may be separated from the open end of the first trench of the second set at a non-active region of the nanowire network.

Not all regions (e.g. points or areas) within a nanowire network serve a quantum and/or electrical purpose. While the whole part of the network plays a specific role in quantum computing, requirements for crystal quality of different parts are different. The part where quantum effects "happen" have the highest requirements for crystal quality. These are termed "active regions". In other words, the quantum or electrical effects necessary for say, quantum computing, are typically confined to certain regions within a nanowire network, e.g. at certain junctions of the network. An active (or operative) region of the nanowire network refers to any region that coincides with said effects, or where said effects are expected to occur. In other words, an operative region is an active region, or a working region of the quantum device. In contrast, a non-operative region refers to a region that does not coincide with said effects, or where said effects are not expected to occur. Therefore the separation between the first and second segments of the mask, i.e. the portion of the mask that separates the open ends of one of the first set of trenches and one of the second set of trenches may be positioned to coincide with a non-operative region of the mask. The inventors assume that defects in the nanowire structure, if any, occur at said separation instead of at random locations. This therefore allows defects to be confined to the non-operative regions instead of occurring randomly throughout operative regions, thus improving the overall quality of the device.

In embodiments, the first and second network of trenches may be formed by etching the amorphous mask from the underlying layer. Alternatively, the trenches may be formed using nanoimprint or other patterning techniques.

In embodiments, a respective pattern of the first and second trenches may be defined by lithography.

In embodiments, the amorphous mask may be a dielectric. In embodiments, the underlying layer may be an insulating material.

In embodiments, the semiconductor material may be grown by epitaxial techniques. For example, the semiconductor material may be grown by molecular beam epitaxy.

In embodiments, the method may comprise, in a superconductor growth phase, growing a layer of superconductor material over at least part of the nanowire network.

In embodiments, the layer of superconductor material may be applied using a particle beam.

In embodiments, the superconductor material may be grown by epitaxy.

According to another aspect disclosed herein, there may be provided a quantum device comprising: a substrate and an amorphous mask formed on an underlying layer of the substrate, wherein the amorphous mask comprises a first segment comprising a first set of trenches, and a second segment comprising a second set of trenches, wherein the first and second segments are non-overlapping, and wherein an open end of a first trench of the first set of trenches is separated from and faces an open end of a first trench of the second set of trenches; and a nanowire network on the underlying layer, wherein the nanowire network is formed from the joining of first and second sub-networks of nanowires over the mask, wherein the first and second sub-networks of nanowires comprise selective area grown semiconductor material, in the first and second sets of trenches.

In embodiments, the device may comprise an electrical conductor connecting the open ends of the first trenches of the first and second set of trenches.

According to another aspect disclosed herein, there may be provided a method of operating the device, wherein the method comprises inducing at least one Majorana zero mode, MZM, in one or more nanowires of the nanowire network, wherein the at least one MZM is induced by cooling the superconductor to a superconducting temperature and applying a magnetic field to the device. The inducing of the at least one MZM may further comprise gating the at least one of the one or more nanowires with an electrostatic potential.

BRIEF DESCRIPTION OF THE DRAWINGS

For a better understanding of the present technology, and to show how embodiments may be carried into effect, reference is made, by way of example only, to the following figures, in which.

DETAILED DESCRIPTION

Epitaxial semiconductor-superconductor materials are a promising platform for superconducting electronics and superconducting quantum computation. In the context of topological quantum computing, superconducting nanowires with strong spin-orbit coupling can support topological excitations that can serve as the basis for fault tolerant quantum information processing.

Current approaches to synthesize semiconductor-superconductor materials for superconducting nanowire electronics are either based on two-dimensional planar materials (see, e.g., Shabani et al. PRB 93, 155402 (2016)) or bottom up grown nanowire materials (see, e.g., Krogstrup et al. Nature Mater. 14, 400-406 (2015)). Both approaches are facing challenges with scalability for different reasons.

Figure 3:
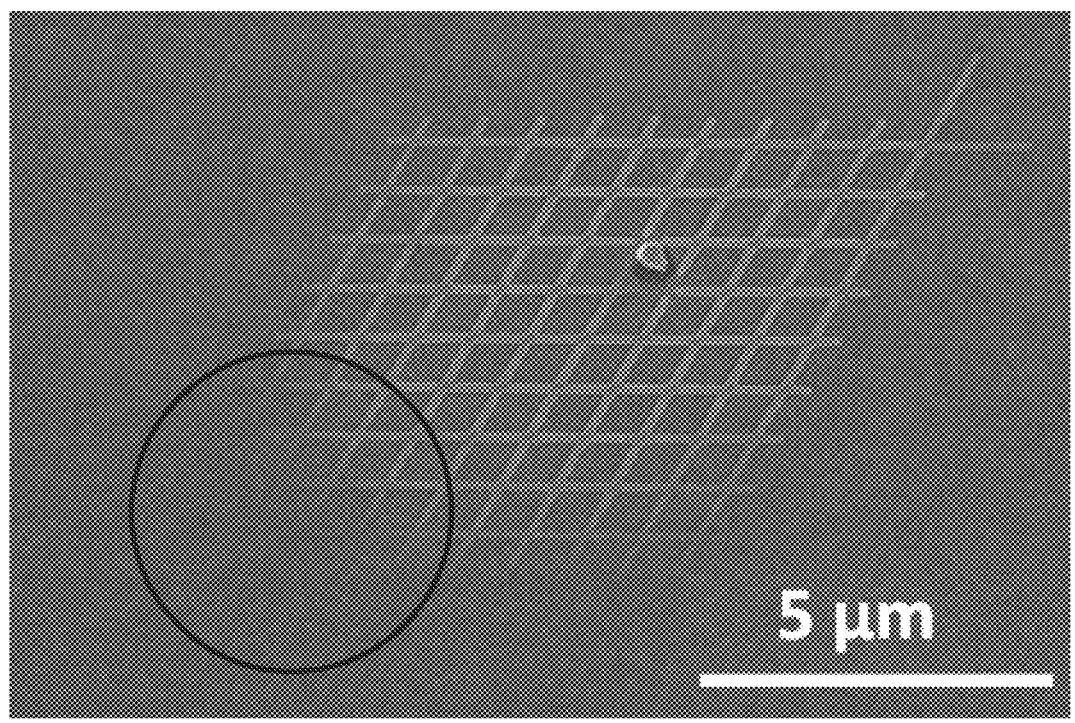
FIG. 3 shows an example SEM image of a partial large scale (>10 μm) nanowire network.
Figure 4:
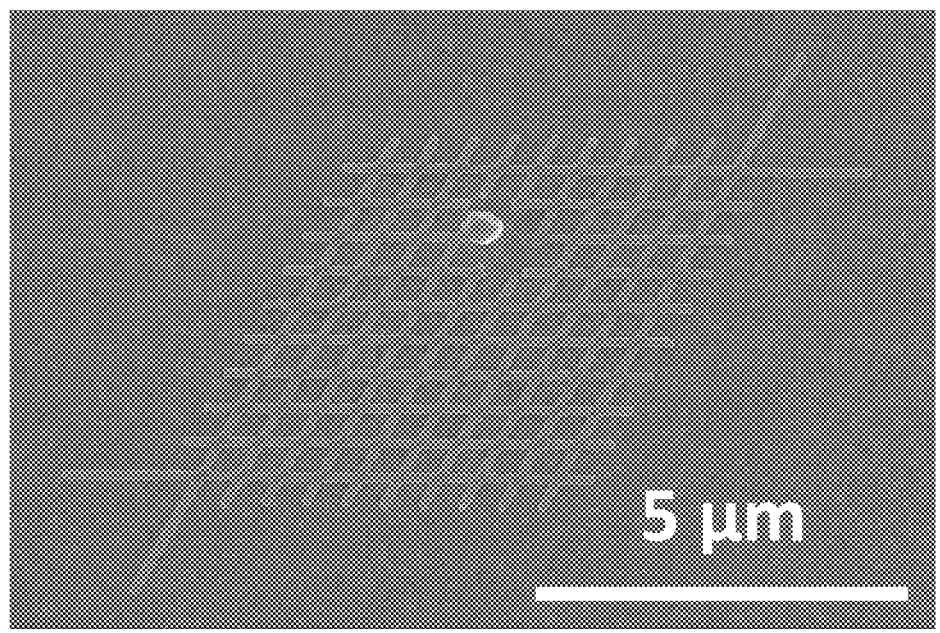
FIGS. 4 and 4A show example SEM images of small scale (<7 μm) nanowire networks.
Figure 4A:
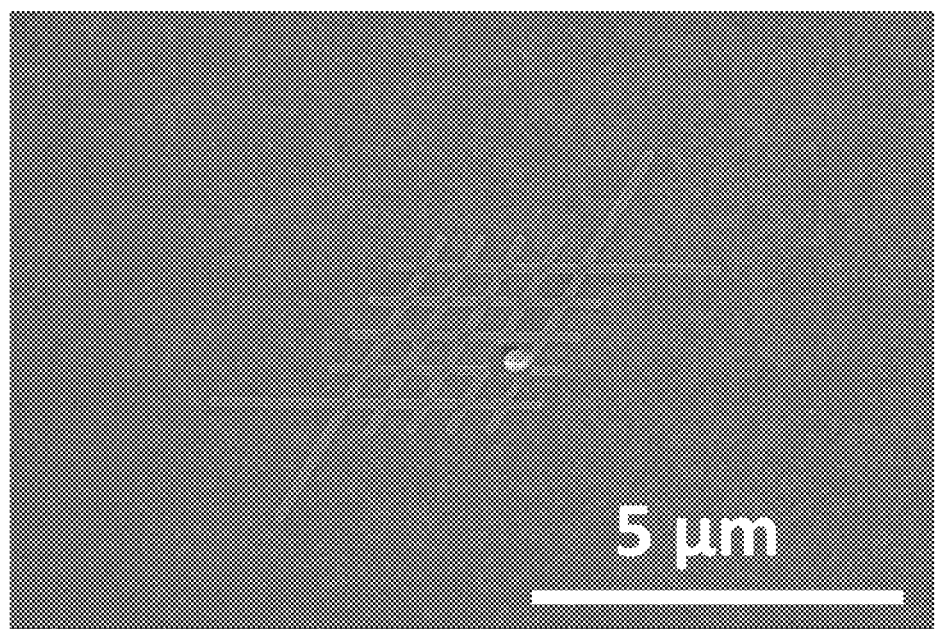

In particular, certain mask-guided fabrication methods yield high-quality structures on a small scale, but cannot be extended to larger structures. FIG. 3 is a scanning electron microscope (SEM) image of a mask used to guide the growth of a nanowire network. The mask, which is larger than 10 μm, has not been completely filled with material after the growth (see the circled part of the image). In contrast, FIGS. 4 and 4A are SEM images show small scale nanowire networks that have grown by complete filling of smaller masks. Here the characteristic size of the mask openings are each less than 7 μm.

Figure 7A:
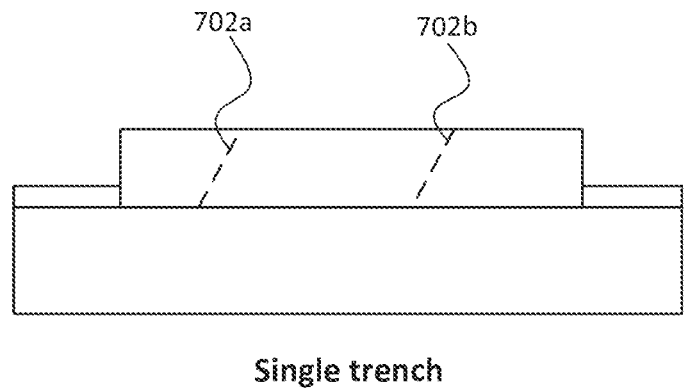
FIGS. 7A and 7B illustrate schematically an example of an uninterrupted mask and an example of a segmented mask defects occurring at random positions within the nanowire.
Figure 8:
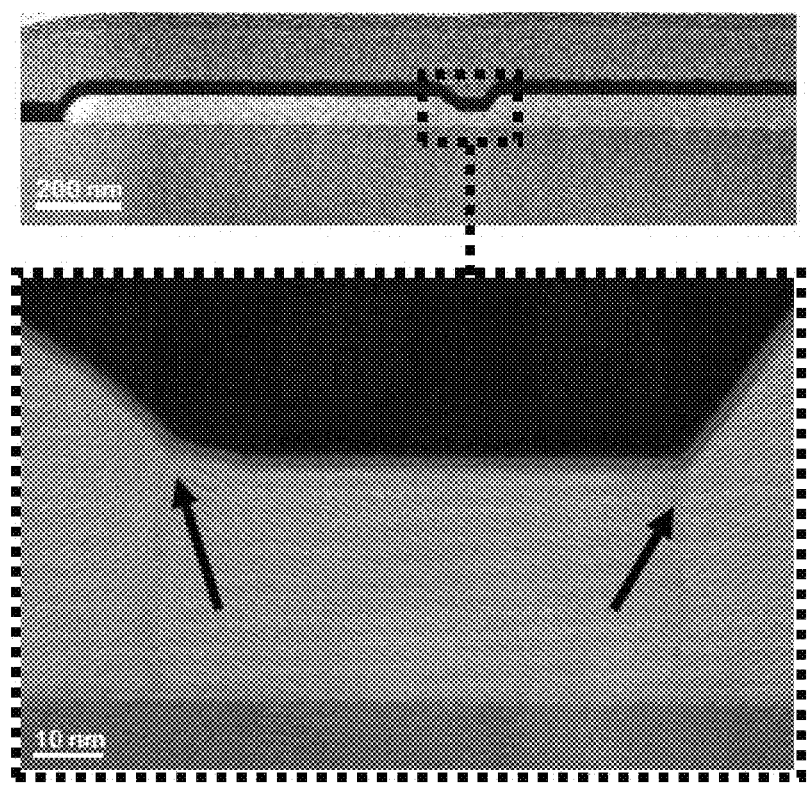
FIG. 8 illustrates an example cross-section TEM of a nanowire with a defect occurring at a random position within the nanowire.

Moreover, in the case where it is possible to achieve large scale networks then the problem of defect formation arises with defects forming at random positions within the network. This is illustrated in the schematic image of FIG. 7A, where a nanowire is grown using an uninterrupted mask, as is the case in previous methods. Here defects 702a, 702b occurs at random positions. The cross-sectional image of FIG. 8, which is a transmission electron microscope (TEM) image of nanowire, shows real example of a defect occurring in a nanowire.

Figure 7B:
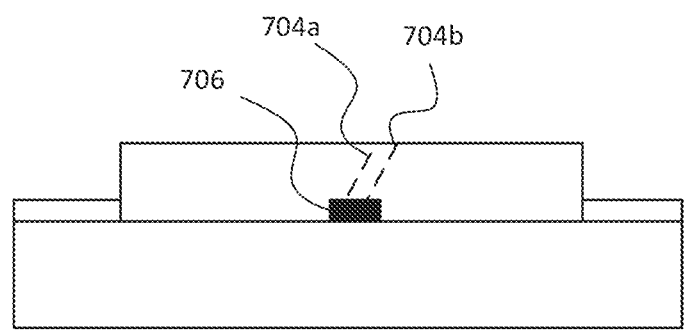

To solve these and other problems, embodiments of the invention use a segmentation approach to fabricate a quantum device, whereby the mask design for large networks is broken down into smaller segments. Once growth happens in the smaller segments forming sub-networks of nanowires, the sub-networks can be joined (e.g. merged). For example, the sub-networks may be joined by lateral extension of the crystal. The resulting structure (network) will be similar to an uninterrupted design, but with defects (if present) confined to the deliberate mask break locations. This is shown schematically in FIG. 7B, where a defect 902a occurs at the break location 904, rather than a random position throughout the nanowire 906. This solves the defect problem. As for the scalability issue, each sub-network grows independently ensuring that each of them is below the critical achievable size for a particular material and growth condition. Any number of fully grown sub-networks can be joined to form a larger network. This ensures unbound scalability of nanowire networks.

Figure 1:
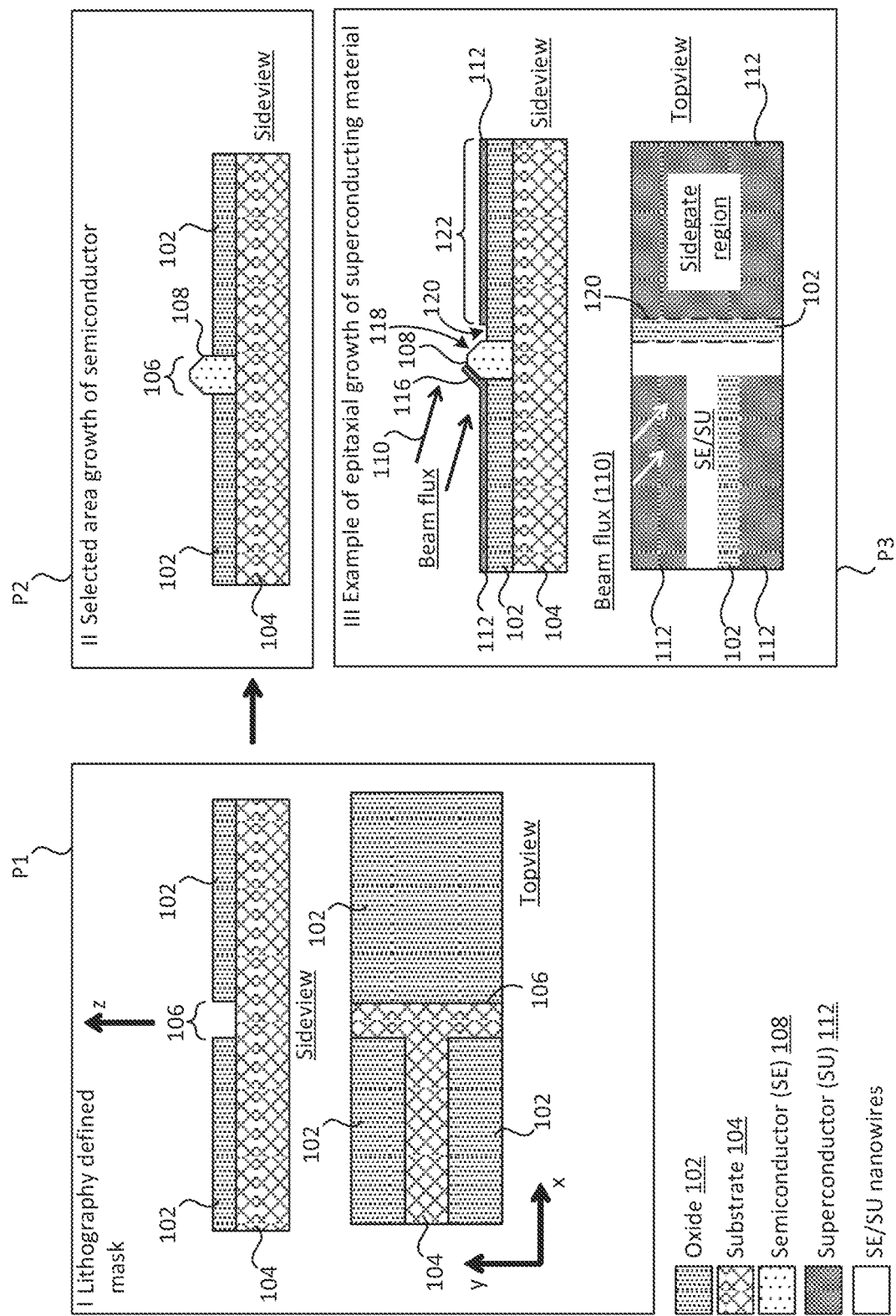
FIG. 1 illustrates schematically an example method for fabricating a network of nanowires.
Figure 5:
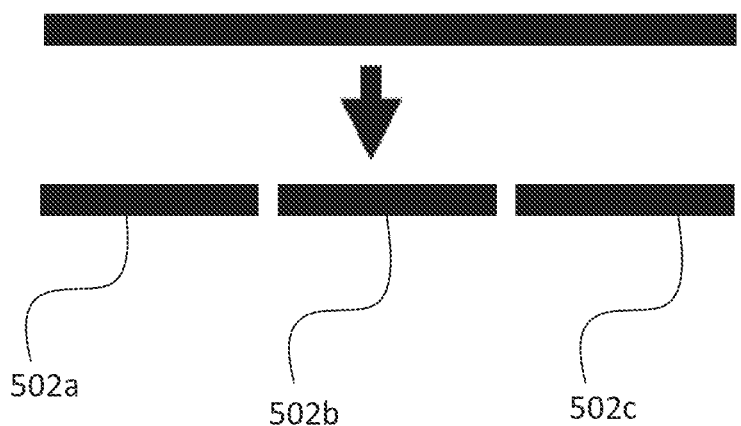
FIGS. 5 and 5A illustrate schematically example sub-networks of nanowires that are joined to form a single nanowire network.
Figure 5A:
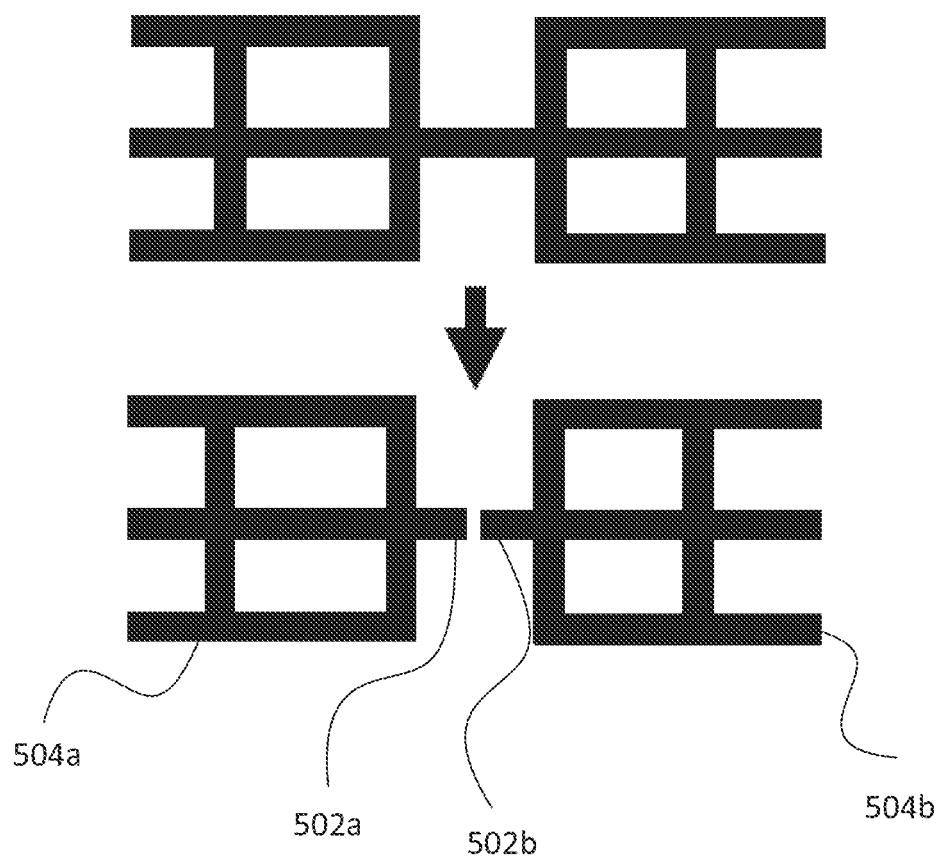

With reference to FIGS. 1, 5 and 5A, an example three-phase fabrication method will now be described. The fabrication method can be used to create a network of semiconductor (SE) and or semiconductor/superconductor (SE/SU) nanowires, which in turn can form the basis of a quantum device or circuit (e.g. for a quantum computer) or other mixed semiconductor-superconductor platform. In particular, the method is particularly suitable for fabricating a SE/SU nanowire network capable of hosting stable MZMs, which can form the basis of fault-free topological quantum computations. Here, an SE/SU nanowire refers to a semiconductor wire coated with a superconductor.

The example fabrication method utilizes selective area growth (SAG). SAG is a growth method using crystal growth vacuum chambers such as, Chemical Beam Epitaxy (CBE), Molecular Beam Epitaxy, and MOCVD. See, e.g., G. J Davies Proc. SPIE 2140, Epitaxial Growth Processes, 58 (May 11, 1994); doi:10.1117/12.175795; M Fahed, Doctoral thesis: Selective area growth of in-plane III-V nanostructures using molecular beam epitaxy, 2016. http://www.theses.fr/2016LIL10114; Fukui et al, Appl. Phys. Lett. 58, 2018 (1991); doi: http://dx.doi.org/10.1063/1.105026.

Because the SE/SU nanowire network is created using SAG, an entire nanowire network or multiple such networks can be fabricated as a whole on an substrate. The substrate and the nanowire network can be incorporated directly into the final product, without any need to transfer the nanowires to a different surface.

Fabrication of quantum devices involves building up a wafer through the deposition of multiple layers or material, usually in different patterns, over a substrate. The overall process involves multiple steps as the different layers are built up. For the following description, the "wafer" will be taken herein to refer to the base layer, and the "substrate" will refer to the wafer plus any other layers already deposited over the wafer at the current stage in the fabrication process.

In a first phase I (a masking phase), an amorphous mask 102 is formed on an underlying layer of a substrate 104. The amorphous mask 102 may be made of a dielectric material. The underlying layer of the substrate may be the substrate 104 itself, or it may be an intermediary layer of material that has been deposited on the substrate. The amorphous mask 102 is made up of a plurality of segments. The following examples will be described in terms of a first segment and a second segment, but it will be appreciated that the described methods apply to more than two segments. Each segment comprises a set of trenches that expose the underlying layer, e.g. the substrate, with the first segment comprising a first set of trenches exposing a first pattern of the underlying layer and the second segment comprising a second set of trenches exposing a second pattern of the underlying layer. The first and second segments may be formed at the same time, or one segment (e.g. the first segment) may be formed first followed by the other segment (e.g. the second segment).

The first and second segments are formed such that they do not overlap, i.e. their trenches do not overlap in space or cover the same area of the underlying layer of the substrate. The first and second segments are also formed such that an open end of one of the first set of trenches (belonging to the first segment of the mask) faces an open end of one of the second set of trenches (belonging to the second segment of the mask). The open ends are separated by a portion of the amorphous mask. That is, the portion of the mask asks as an initial barrier between the open ends of the trenches that face each other. This is illustrated schematically in the examples of FIGS. 5 and 5A. In FIG. 5, a trench 502a of a first set of trenches (belonging to a first segment of a mask) faces a trench 502b of a second set of trenches (belonging to a second segment of a mask). The separation of the trenches is highlighted by the dotted-line box. In this example, an open end of the trench 502b of the second set of trenches faces an open end of a trench 502c of a third set of trenches (belonging to a third segment of the mask). Similarly, in FIG. 5A a trench 502a of a first set of trenches 504a (belonging to a first segment of a mask) faces a trench 502b of a second set of trenches 504b (belonging to a second segment of a mask).

Amorphous materials cannot sustain epitaxial growth. That is, they inhibit the growth in areas where they are deposited on the substrate, while the growth can proceed on the crystalline substrate where the mask is open.

In general, the first and second segments may be the same size or different sizes. The first and second segments may be the same shape or different shapes.

In the example of FIG. 1, a patterned layer of amorphous material 102 (amorphous mask) is formed on top of a substrate 104. A side-view and a top-view of the substrate 104 with the amorphous mask 102 are shown on the left hand side of FIG. 1. The substrate 104 can be formed of any suitable substrate material such as InP (Indium Phosphide), and is an insulating substrate in the described examples. In the described examples, the mask material 102 is an oxide but it can be any amorphous material that facilitates SAG in a second phase II of the fabrication method (see below).

The amorphous mask or oxide layer 102 is patterned in that the oxide layer 102 is formed so as to leave trenches (or narrow strips) of the substrate—in a desired region 106—exposed (i.e. not covered by the mask 102). The pattern in this context refers to the structure of the desired region 106, which will ultimately become the structure of the nanowire network, as it is this exposed region 106 in which SE nanowires are grown. Accordingly, the size and structure of the nanowires matches the size and structure of the exposed region 106. Although only one exposed region 106 is shown in FIG. 1, nanowires can be grown simultaneously in multiple regions and all description pertaining to the desired region 106 applies equally to multiple such regions. Accordingly, the structure of an entire nanowire network can be defined by the structure of the exposed region(s), which are themselves defined by the structure of the trenches of each segment of the mask. In this example, the strips and hence the resulting nanowires have a width of the order of tens or hundreds of nanometers.

The amorphous mask 102 can be formed so as to leave the desired region 106 exposed in any suitable manner. For example, a uniform, continuous layer of an amorphous material such as an oxide can be deposited on the substrate 104 or other underlying layer, and the exposed region 106 can then be formed by selectively etching away the amorphous mask 102 from the desired region 106 (in this case, it is the lithography and the following etching that defines the eventual nanowire network structure). As another example, the insulating material 102 can be selectively deposited on the substrate 104 with a mask used to prevent deposition of the material (e.g. oxide) 102 in the desired regions 106 (in this case, it is the mask that defined the eventual nanowire network structure). The oxide 102 may for example be silicon oxide ($SiO_x$). More generally, other suitable amorphous materials could be used.

In a second phase II (a semiconductor growth phase, or a SAG phase), a semiconductor material 108 is grown in the first and second sets of trenches exposing the underlying layer of the substrate. In the case where the underlying layer is the substrate itself, the semiconductor material 108 is grown on the exposed portions of the substrate. Growth of the semiconductor material is initiated in each set of trenches. The selective-area-grown semiconductor material forms first and second sub-networks of nanowires in each of the sets of trenches. Each sub-network of nanowire may comprise one or more nanowires. As shown in the example of FIG. 5, each segment comprises a single trench and therefore each corresponding sub-network comprises a single nanowire. In contrast, in the example of FIG. 5A each segment comprises multiple trenches and therefore each corresponding sub-network comprises multiple nanowires.

Referring back to the example of FIG. 1, semiconductor material 108 is selectively grown within the desired regions 106, on top of the exposed portion of the substrate 104. An example is illustrated at the top right of FIG. 1, at which a side-view of the substrate 104 is shown. Due to the patterning of the amorphous mask 102, the selectively grown semiconductor 108 forms in-plane nanowires (that is, nanowires are grown as the whole from the opening; growth proceeds in the z-direction across the entire set of openings defined in the x-y plane). The semiconductor material 108 may for example be Indium Arsenide (InAs), Indium Antimonide (InSb), or any other semiconductor with relatively large spin orbit and G-factor, or set of more than one material (heterostructures comprised of several materials).

The SAG semiconductor 108 can for example be confined 2DEG (two-dimensional electron gas) semiconductor or single material semiconductor.

SAG is a growth method. SAG refers to localized growth of semiconductor in exposed regions of the substrate, with growth conditions selected to prevent such growth on the amorphous mask itself. This can be based on Chemical Beam Epitaxy (CBE), Molecular Beam Epitaxy (MBE), or Metal-Organic Chemical Vapour Deposition (MOCVD), for example. In the context of semiconductors, SAG may refer to a class of epitaxial semiconductor growth (and is also referred to as selective area epitaxy), in which a patterned amorphous mask is used to define the intended structure of the semiconductor material to be grown (a form of lithography). Epitaxy refers to a technique whereby a second crystal is grown on a first crystal using the first as a seed crystal. In SAG, the process is tuned such that semiconductor growth occurs only on regions of the substrate that are not covered by the amorphous mask 102, and not on the amorphous mask itself, e.g. not on the amorphous mask. This is different from other deposition/growth processes, such as uniform deposition (epitaxial or otherwise) when no mask is used in which material is uniformly deposited across a surface irrespective of its material composition (as in phase III—see below). SAG may be conducted in a high or ultra-high vacuum, and may require careful tuning to achieve the desired selective semiconductor growth.

Any suitable SAG process can be used in the second phase II to create the desired SE nanowires in the exposed region 106. The SAG nanowires are defined along high symmetry in-plane crystal orientations on the substrate, which also gives well-defined faceting of the nanowires. This makes the SU/SE interface flat, potentially atomically flat, and well defined.

SAG per-se is known, and is therefore not discussed in further detail herein. For reference, see Aseev P. et al., Selectivity Map for Molecular Beam Epitaxy of Advanced III-V Quantum Nanowire Networks, DOI: 10.1021/acs.nanolett.8b03733, https://pubs.acs.org/doi/10.1021/acs.nanolett.8b03733.

For further description of SAG, see for example the above-cited references by G. J. Davies, M Fahed, and Fukui et al.

Suffice it to say that the semiconductor growth phase (i.e. the SAG phase II) is such that, at the end of that phase, the semiconductor material 108 fills the desired region 106 (that is, the regions 106 in which the underlying layer or substrate 104 is not covered by the mask 102) but does not extend substantially, in the plane of the underlying layer or substrate 104 (xy-plane hereafter), beyond the boundaries of the desired region 106 as defined the mask 102. In some cases it may extend outwardly in a direction normal (perpendicular) to the plane of the underlying layer or substrate 104 (z-direction hereafter) so as to protrude outwardly of the mask 102. That is, the semiconductor material 108 extends a greater distance from the underlying layer or substrate 104 than the mask 102 in the z-direction. In this manner, the semiconductor material 108 forms nanowires lying substantially in the plane of the underlying layer or substrate 102 (in-place nanowires).

Figure 6:
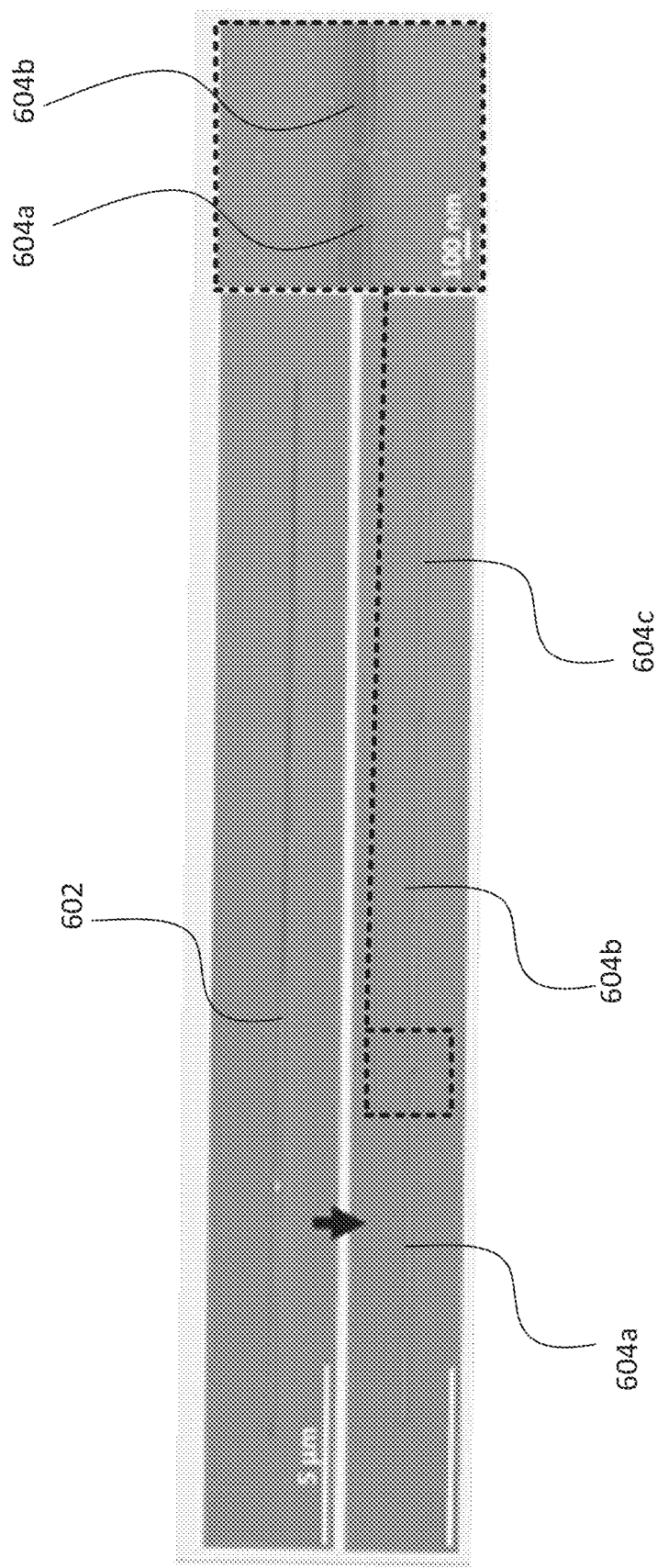
FIG. 6 illustrates example SEM images demonstrating a segmentation approach on a 30 μm line divided into 10 μm segments, and the inset shows a close up of the gap between the segments.

Once the first and second sub-networks of nanowires are formed they are joined to form a single nanowire network. The nanowire network, being the sum of the sub-networks, is thus larger than each of the sub-networks. This enables large scale networks to be built from smaller sub-networks. The joining of the sub-networks may occur naturally. That is, the sub-networks may merge by lateral growth of the semiconductor during (or at the end of) the semiconductor growth phase. In other words, the previously separated open ends of the trenches that face each other extend laterally to merge with one another. An example of this phenomenon is shown in FIG. 6. The top image in FIG. 6 illustrates a 30 m trench 602 that are only partially filled during growth of a nanowire. The bottom image illustrates three separate 10 m trenches 604a, 604b, 604c that are fully filled during growth of the nanowires. The image is taken prior to merger of the trenches. The zoomed-in image shows the first and second sub-networks of nanowires prior to merger.

Alternatively, the first and second sub-networks may be joined after the semiconductor growth phase (but before any superconductor growth phase, if any). The sub-networks may be connected using an electrical conductor, e.g. a metallic lead or material. That is, the open ends of the separated trenches are connected with an electrically conductive material.

However the sub-networks are joined over the amorphous mask. That is, the lateral extension of the semiconductor causes the semiconductor material to grow over the portion of the mask that acts as a barrier between the open-ended trenches. Alternatively, an electrical conductor is placed over the portion to connect the open-ended trenches.

It is the nature of the SAG process that the larger the structure being grown, the more susceptible it is to the formation of defects in the form of threading dislocations or similar type of defects. By dividing into segments with deliberate breaks in the mask, this attracts defects formation to near the deliberate breaks and prevents unintended defects forming elsewhere. This therefore allows for the control of defects and the formation of any arbitrarily sized superstructure.

During the semiconductor growth phase, several types of semiconductor materials can be grown to form stacks (heterostructures). In an optional third phase III (a superconductor growth phase) one or more layers of superconducting material 112 may be grown over at least part of the nanowire network. In some examples, other materials (e.g. dielectrics) may be grown. In the example of FIG. 1, the layer of superconducting material is grown using a particle beam 110. Herein, a superconducting material means a material that exhibits superconducting properties at least under certain conditions. An example of such a material is aluminum (Al). Alternatively the superconductor material 112 could be niobium (Nb), titanium nitride (TiN), or any other s-wave superconductor. In the following examples, the superconductor is grown epitaxially in phase III, and the superconductor growth phase III may be referred to as an epitaxial growth phase in this context. However, the technology is not limited in this respect, and it may be possible to achieve the intended result via non-epitaxial superconductor growth in phase III.

The superconducting material 112 can be grown in phase III using molecular beam epitaxy (MBE) or e-beam evaporation, for example.

At least part of the superconductor layer 112 is deposited on top of the SE nanowire 108 such that this part of the superconductor layer 112 (labelled 116 in FIG. 1) is in direct contact with the SE 108 of the nanowire. That is, such that the semiconductor 108 of the nanowire is at least partially covered with superconducting material.

This is also a form of epitaxy, but it is not SAG. In particular, in the epitaxial growth phase III, epitaxial growth does occur on the amorphous mask (or dielectric layer) 102, as well as on the SE 108 of the nanowires.

In some examples, after growth of one or more layers during phase III, one or more layers of semiconductor material may again be grown.

In one possible technique, the beam can be angled in substantially the z-direction (the direction perpendicular to the plane of the substrate) such that essentially all of the exposed surfaces of the amorphous mask 102 and the SE material 108 are covered by the SU layer 112. However, in another example as illustrated, the particle beam 110 is incident on the substrate 104 with a non-zero angle of incidence relative to the z-direction (deposition angle). As a consequence of this non-zero deposition angle and the protruding structure of the SE core 108 of the nanowire, the SE of the nanowire is only partially coated by the superconductor layer 112; that is, a part of the SE nanowire core (labelled 118) is not coated by the superconductor material. The bulk of the amorphous mask 102 is also coated by the superconductor layer 112, however due to the angle of the incoming beam 110 and the protruding structure of the SE nanowire cores 108, small regions of the amorphous mask 102 (shadow regions) immediately adjacent the protruding SE nanowires 108 are left exposed, i.e. not coated by the SU material. One such shadow region is labelled 120 in FIG. 1. The shadow region 120 separates the SE material 108 from a portion of the SU layer 112 in a "side gate" region 122. The portion of the SU layer 112 in the side gate region 122 can be used to form a gate for controlling the nanowires, or (more likely) the SU material can be etched away from this region and replaced with a more suitable gate material. Either way, the shadow gap 120 ensures the gate operates as intended. Forming the gap 120 using such "in-situ" patterning in the SU epitaxy phase III (as described above) ensures that material does not need to be etched away too close to the delicate nanowires 108.

The SAG phase II and superconductor growth phase III can be conducted in a vacuum chamber, preferably without moving the substrate 104 between phases. These phases can be carried out under high vacuum or ultra-high vacuum conditions, and those vacuum conditions may be maintained between phases. Among other things, this ensures a clean SE/SU interface, free from unwanted impurities.

Both the SAG semiconductor growth of phase II and the superconductor growth of phase III require carefully calibrated conditions to get within respective "growth windows" for these two phases, and thereby achieve the desired semiconductor and superconductor growth respectively. The growth conditions, temperature and flux are chosen dependent on the material type. For example, for MBE (which can be used in both the semiconductor SAG phase II and superconductor growth phase III), the substrate is generally heated to temperatures of around 500° C. or more to clean the surface for native oxide. However, in the SE SAG growth phase II and SU growth phase III, the respective temperature windows in which the desired growth takes place is dependent on the composition of the SE material 108 and SU material 112 respectively. The superconductor may be grown/deposited in-situ, without breaking vacuum. In this way the surface of SAG is not oxidized in air and remain clean until the SU is put on, which ensure a clean SE-SU interface.

The substrate (or underlying layer of the substrate) 104 and mask 102 on which the SE/SU nanowire network is grown can be incorporated in the end-product, such as a quantum circuit or quantum computer, along with the SE/SU nanowire network, without transferring the nanowires from the substrate on which they were originally fabricated.

In summary, instead of fabricating large structures in one piece, an array of smaller structures are fabricated which are then interconnected into a large structure. This may be done by placing the mask openings close to each other and allowing nanostructures to merge during the growth process. This allows fabrication of large networks without the need for additional material to connect the structures. This is particularly beneficial for structures where maintaining the same set of materials across the whole nanowire network is crucial, e.g. in quantum computing.

The masking phase may comprise: 1. deposition of the amorphous mask film on a crystalline substrate, 2. lithographically defining the position of all trenches, thus positioning trenches close to each other to achieve segmentation, 3. removing mask material inside the trenches to open crystalline material of the substrate to be exposed for epitaxy, 4. growth. The growth phase may comprise epitaxial growth of nanowire networks.

The growth phase may utilize metal-sourced selective area growth (MS SAG). MS SAG is a three step process. During step (i), Indium (In) is deposited at an elevated temperature $T_{(i)}$) to collect In only inside the mask openings and avoid its accumulation on the mask surface. This is possible due to higher desorption rate of In adatoms from the amorphous mask compared to crystalline substrate surface. During step (ii), the substrate is cooled below the critical temperature $T_{(ii)} \leq T_{crit}$ for the subsequent conversion of In into InSb supplying only Sb flux. Note that despite only Sb flux being supplied externally the growth proceeds under local In-rich regime around the droplet which acts as a metal reservoir. During step (iii), the substrate temperature is raised to $T_{(iii)}$ at which selective InSb growth can proceed with both In and Sb fluxes supplied simultaneously.

In some examples, the initial selective In deposition of step (i) is performed under conditions of approximately $T_{(i)}$=465° C., $F_{In}$=0.16 $ML_{InSb}$/s, t=10 min. These conditions favour selectively. During step (ii), the conversion of In into InSb solely under Sb flux is performed under conditions of approximately $T_{(ii)}$=360° C., $F_{Sb}$=0.22 $ML_{InSb}$/s, t=10 min. These conditions favour nucleation. Whilst selectively is not favoured at these conditions, growth of InSb proceeds only inside the mas because In atoms are present only there and their probability of travelling to the mask is low. During step (iii), SAG of InSb with simultaneous supply of In and Sb fluxes at elevated substrate temperatures is performed under conditions of approximately $T_{(iii)}$=430° C., $F_{In}$=0.03 $ML_{InSb}$/s, $F_{Sb}$=0.38 $ML_{InSb}$/s, t=60 min. These conditions favour selectively. Here, T is the substrate temperature, $F_{In}$ and $F_{Sb}$ are fluxes of In and Sb respectively measured in equivalent 2D monolayers grown per second $ML_{InSb}$/s, and t is duration of each step.

Figure 2A:
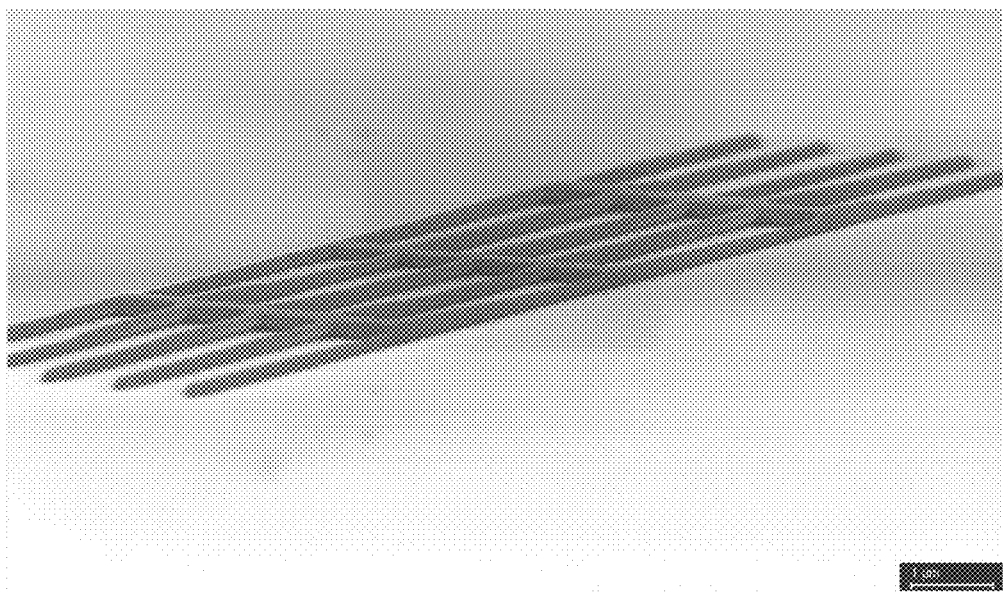
FIGS. 2A and 2B show examples of selective area grown nanowire networks.
Figure 2B:
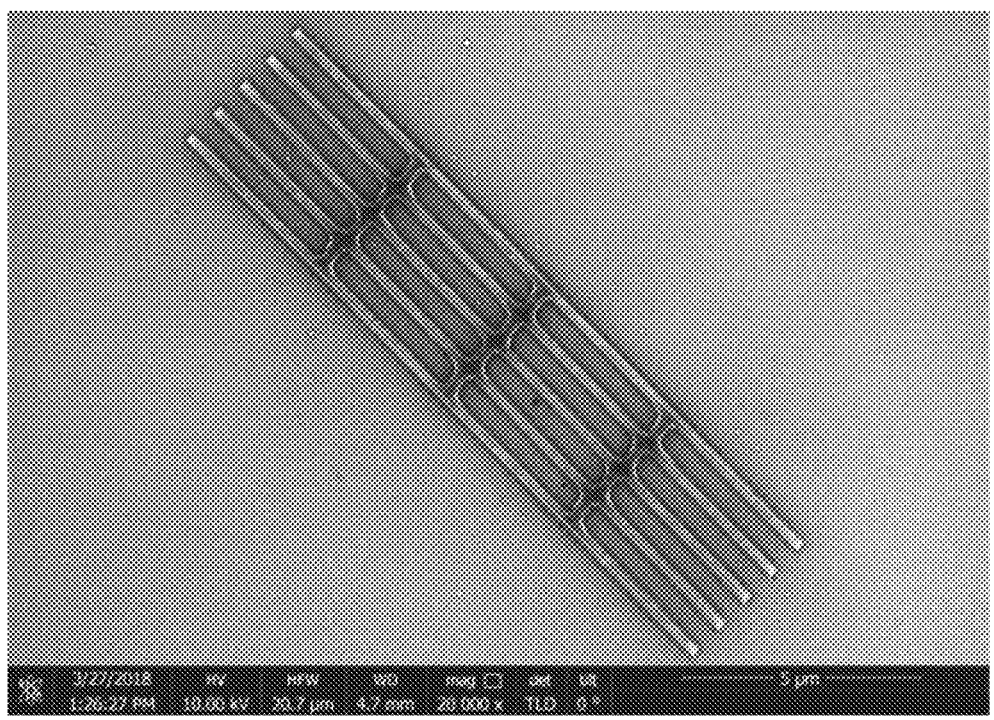

Embodiments of the disclosed technology include topologically protected quantum computing circuits that comprise networks of nanowires formed using such mixed semiconductor and superconductor regions. In FIG. 2, for instance, a wire-pattern consisting of InAs nanowires grown on an insulating GaAs substrate is shown. In particular, FIG. 2 shows the fabrication of a complicated network based on one-dimensional nanowire network.

As noted, the selective area growth (SAG) of nanowire networks can be used to produce Majorana-based topological qubits, which utilize the formation of superconducting islands, some parts of which are topological (T) and some parts of which are non-topological (e.g., conventional s-wave (S)). SAG techniques can provide a high degree of control over the shape of the produced devices, and thus are useful in producing the components used in scalable topological quantum computation. In example embodiments, one or more Majorana zero modes, MZM, may be induced in at least one nanowire of the nanowire network by cooling the superconductor to a superconducting temperature and applying a magnetic field to the device.

The examples described herein are to be understood as illustrative examples of embodiments of the invention. Further embodiments and examples are envisaged. Any feature described in relation to any one example or embodiment may be used alone or in combination with other features. In addition, any feature described in relation to any one example or embodiment may also be used in combination with one or more features of any other of the examples or embodiments, or any combination of any other of the examples or embodiments. Furthermore, equivalents and modifications not described herein may also be employed within the scope of the invention, which is defined in the claims.

The invention claimed is:

1. A quantum device comprising:
a substrate and an amorphous mask layer formed on the substrate, wherein the amorphous mask layer comprises a first segment defines a first set of trenches extending along a surface of the substrate, and a second segment defining a second set of trenches extending along the surface of the substrate, wherein the first and second segments are non-overlapping, and wherein an open end of a first trench of the first set of trenches is separated from and faces an open end of a first trench of the second set of trenches; and
a nanowire network contacting the surface of the substrate, wherein the nanowire network includes first and second sub-networks of nanowires, wherein the first and second sub-networks of nanowires comprise semiconductor material situated in the first set of trenches and the second set of trenches, the semiconductor material contacting the surface of the substrate and extending to sidewalls of the first and second sets of trenches defined by the amorphous mask layer.

2. The quantum device of claim 1, further comprising an electrical conductor connecting the open end of the first trench of the first set of trenches and the open end of the first trench of the second set of trenches.

3. The quantum device of claim 1, wherein the substrate comprises a wafer.

4. The quantum device of claim 1, wherein the amorphous mask is a dielectric.

5. The quantum device of claim 1, wherein the semiconductor material is indium antimonide.

6. The quantum device of claim 1, further comprising a layer of superconductor material grown at least partially over the nanowire network.

7. A method of operating the quantum device of claim 6, wherein the method comprises inducing at least one Majorana zero mode (MZM) in one or more nanowires of the nanowire network, wherein the at least one MZM is induced by cooling the layer of superconductor material to a superconducting temperature and applying a magnetic field to the quantum device.

8. The quantum device of claim 6, wherein the layer of superconductor material is aluminum, niobium, or titanium nitride or an s-wave superconductor.

9. The quantum device of claim 1, wherein the semiconductor material is indium arsenide or a confined two dimensional electron gas (2DEG) semiconductor.

10. The quantum device of claim 1, wherein the semiconductor material is a heterostructure.

11. The quantum device of claim 1, wherein the semiconductor material joins the first and second sub-networks of nanowires.

12. A quantum device comprising:
a substrate and an amorphous mask formed on an underlying layer of the substrate, wherein the amorphous mask comprises a first segment comprising a first set of trenches, and a second segment comprising a second set of trenches, wherein the first and second segments are non-overlapping, and wherein an open end of a first trench of the first set of trenches is separated from and faces a first trench of the second set of trenches; and
a nanowire network on the underlying layer, wherein the nanowire network is formed from a joining of first and second sub-networks of nanowires over the amorphous mask, wherein the first and second sub-networks of nanowires comprise semiconductor material grown in the first set of trenches and the second set of trenches, wherein the semiconductor material includes a portion situated on the amorphous mask so that the portion joins the first and second sub-networks of nanowires.

13. The quantum device of claim 1, further comprising a conductor joining the first and second sub-networks of nanowires.

14. The quantum device of claim 1, wherein a portion of the semiconductor material protrudes from the substrate beyond the amorphous mask.

15. A quantum device comprising:
a substrate and an amorphous mask formed on an underlying layer of the substrate, wherein the amorphous mask comprises a first segment comprising a first set of trenches, and a second segment comprising a second set of trenches, wherein the first and second segments are non-overlapping, and wherein an open end of a first trench of the first set of trenches is separated from and faces a first trench of the second set of trenches;
a nanowire network on the underlying layer, wherein the nanowire network is formed from a joining of first and second sub-networks of nanowires over the amorphous mask, wherein the first and second sub-networks of nanowires comprise semiconductor material situated in the first set of trenches and the second set of trenches and a portion of the semiconductor material protrudes from the substrate beyond the amorphous mask; and
a layer of superconductor material grown at least partially over the semiconductor material of the nanowire network and the portion of the semiconductor material protruding from the substrate beyond the amorphous mask joining the first and second sub-networks of nanowires.

16. The quantum device of claim 15, wherein the first and second sub-networks of nanowires are joined by the portion of the semiconductor material protruding from the substrate beyond the amorphous mask and further comprising a layer of superconductor material situated over the portion of the semiconductor material and joining the first and second sub-networks of nanowires, the layer of superconductor material defining shadow regions that are uncoated by the layer of superconductor material.

17. A quantum device comprising:
a substrate and an amorphous mask formed on an underlying layer of the substrate, wherein the amorphous mask comprises a first segment comprising a first set of trenches, and a second segment comprising a second set of trenches, wherein the first and second segments are non-overlapping, and wherein an open end of a first trench of the first set of trenches is separated from and faces a first trench of the second set of trenches; and
a nanowire network on the underlying layer, wherein the nanowire network is formed from a joining of first and second sub-networks of nanowires over the amorphous mask, wherein the first and second sub-networks of nanowires comprise semiconductor material situated in the first set of trenches and the second set of trenches, wherein the semiconductor material grown in the first set of trenches and the second set of trenches protrudes from the amorphous mask and further comprising a layer of a superconductor material situated over a portion of shadow regions that are uncoated by the superconductor material.

18. A method of fabricating a quantum device comprising:
forming an amorphous mask on a substrate, wherein the amorphous mask comprises a first segment comprising a first set of trenches extending to and along a surface of the substrate and a second segment comprising a second set of trenches extending to and along the surface of the substrate, wherein the first and second segments are non-overlapping, and wherein an open end of a first trench of the first set of trenches is separated from and faces an open end of a first trench of the second set of trenches; and
forming a nanowire network on the substrate, wherein the nanowire network is formed from the joining of first and second sub-networks of nanowires, wherein the first and second sub-networks of nanowires comprise semiconductor material grown in the first set of trenches and the second set of trenches and the semiconductor material includes a portion situated on the amorphous mask so that the portion joins the first and second sub-networks of nanowires.

19. The method of claim 18, wherein the forming the amorphous mask comprises:
- in a masking phase:
    - forming the first segment of the amorphous mask on the substrate, wherein the first set of trenches exposes the substrate;
    - forming the second segment of the amorphous mask on the substrate, wherein the second segment comprises a second set of trenches exposing the substrate, wherein the open end of one of the first set of trenches is separated from the open end of one of the second set of trenches by portion of the amorphous mask; and
- in a semiconductor growth phase, growing, by selective-area-growth, the semiconductor material in the first set of trenches and the second set of trenches to form the first and second sub-networks of nanowires on the substrate.

\* \* \* \* \*